(12) United States Patent  
Barber et al.

(10) Patent No.: US 6,603,241 B1
(45) Date of Patent: Aug. 5, 2003

(54) ACOUSTIC MIRROR MATERIALS FOR ACOUSTIC DEVICES

(75) Inventors: Bradley Paul Barber, Chatham, NJ (US); Harold Alexis Huggins, Watchung, NJ (US); Ronald Eugene Miller, Riegelsville, PA (US); Donald Winslow Murphy, Green Brook, NJ (US); Yiu-Huen Wong, Summit, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/576,807

(22) Filed: May 23, 2000

(51) Int. Cl.[7] .................................................. H03H 9/25
(52) U.S. Cl. ....................................................... 310/335
(58) Field of Search ................................. 310/324, 346, 310/334, 335; 427/100

(56) References Cited

U.S. PATENT DOCUMENTS

| | | | |
|---|---|---|---|
| 4,368,401 A | * | 1/1983 | Martin et al. ................ 188/268 |
| 4,418,299 A | * | 11/1983 | Momosaki ................... 310/312 |
| 4,502,932 A | | 3/1985 | Kline et al. |
| 4,556,812 A | | 12/1985 | Kline et al. |
| 4,628,223 A | * | 12/1986 | Takeuchi et al. ............. 310/334 |
| 4,719,383 A | | 1/1988 | Wang et al. |
| 4,890,370 A | | 1/1990 | Fukuda et al. |
| 4,988,957 A | | 1/1991 | Thompson et al. |
| 5,075,641 A | | 12/1991 | Weber et al. |
| 5,166,646 A | | 11/1992 | Avanic et al. |
| 5,231,327 A | | 7/1993 | Ketcham |
| 5,232,571 A | | 8/1993 | Braymen |
| 5,263,259 A | | 11/1993 | Cimador |
| 5,283,458 A | | 2/1994 | Stokes et al. |
| 5,294,898 A | | 3/1994 | Dworsky et al. |
| 5,303,457 A | | 4/1994 | Falkner, Jr. et al. |
| 5,334,960 A | | 8/1994 | Penunuri |
| 5,348,617 A | | 9/1994 | Braymen |
| 5,367,308 A | | 11/1994 | Weber |
| 5,381,385 A | | 1/1995 | Greenstein |
| 5,403,701 A | | 4/1995 | Lum et al. |
| 5,404,628 A | | 4/1995 | Ketcham |
| 5,438,554 A | | 8/1995 | Seyed-Bolorforosh et al. |
| 5,446,306 A | | 8/1995 | Stokes et al. |
| 5,552,655 A | | 9/1996 | Stokes et al. |
| 5,587,620 A | | 12/1996 | Ruby et al. |
| 5,596,239 A | | 1/1997 | Dydyk |
| 5,617,065 A | | 4/1997 | Dydyk |
| 5,630,949 A | | 5/1997 | Lakin |
| 5,646,583 A | * | 7/1997 | Seabury et al. ............. 310/320 |
| 5,692,279 A | | 12/1997 | Mang et al. |
| 5,698,928 A | | 12/1997 | Mang et al. |
| 5,702,775 A | | 12/1997 | Anderson et al. |
| 5,714,917 A | | 2/1998 | Ella |
| 5,760,663 A | | 6/1998 | Pradal |
| 5,780,713 A | | 7/1998 | Ruby |
| 5,789,845 A | | 8/1998 | Wadaka et al. |
| 5,821,833 A | | 10/1998 | Lakin |
| 5,853,601 A | | 12/1998 | Krishaswamy et al. |

(List continued on next page.)

*Primary Examiner*—Thomas M. Dougherty
*Assistant Examiner*—Karen Addison
(74) *Attorney, Agent, or Firm*—Harness, Dickey & Pierce, P.L.C.

(57) ABSTRACT

A reflector stack or acoustic mirror arrangement for an acoustic device is described which may attain the highest possible impedance mismatch between alternating higher and lower impedance reflecting layers of the stack, so as to maximize bandwidth. The arrangement may also reduce manufacturing costs by requiring fewer layers for the device, as compared to conventional acoustic mirrors. The thinner reflecting stack is accordingly fabricated in reduced time to lower cost, by incorporating materials providing a larger acoustic impedance mismatch than those currently obtainable. The bandwidth of the resulting acoustic resonator device may be widened, particularly when a low density material such as aerogel, CVD $SiO_2$ and/or sputter deposited $SiO_2$ is applied as topmost layer in the reflector stack/acoustic mirror arrangement of the device.

29 Claims, 2 Drawing Sheets

U.S. PATENT DOCUMENTS

| | | |
|---|---|---|
| 5,864,261 A | 1/1999 | Weber |
| 5,872,493 A | 2/1999 | Ella |
| 5,873,153 A | 2/1999 | Ruby et al. |
| 5,873,154 A * | 2/1999 | Ylilammi et al. .......... 29/25.35 |
| 5,883,575 A | 3/1999 | Ruby et al. |
| 5,884,378 A | 3/1999 | Dydyk |
| 5,894,647 A | 4/1999 | Lakin |
| 5,910,756 A | 6/1999 | Ella |
| 5,928,598 A | 7/1999 | Anderson et al. |
| 5,942,958 A | 8/1999 | Lakin |
| 5,963,856 A | 10/1999 | Kim |
| 6,051,907 A | 4/2000 | Ylilammi |
| 6,060,818 A | 5/2000 | Ruby et al. |
| 6,081,171 A | 6/2000 | Ella |
| 6,087,198 A | 7/2000 | Panasik |
| 6,127,768 A | 10/2000 | Stoner et al. |
| 6,150,703 A | 11/2000 | Cushman et al. |
| 6,185,589 B1 | 2/2001 | Votipka |
| 6,198,208 B1 | 3/2001 | Yano et al. |
| 6,204,737 B1 | 3/2001 | Ella |
| 6,215,375 B1 | 4/2001 | Larson, III et al. |

\* cited by examiner

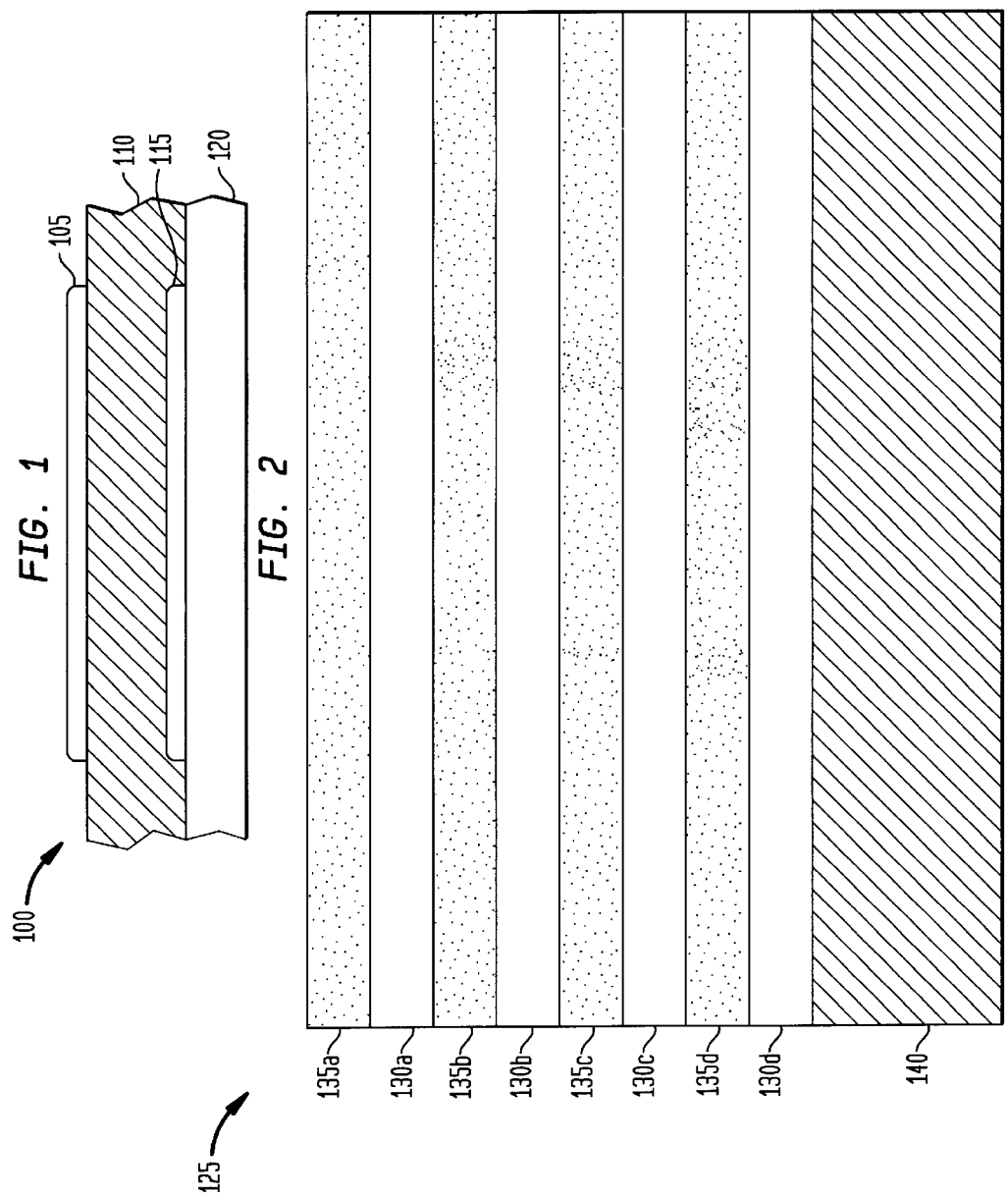

ACOUSTIC MIRROR MATERIALS FOR ACOUSTIC DEVICES

FIELD OF THE INVENTION

The present invention relates to bulk acoustic wave devices such as acoustic resonators, and more particularly to acoustic mirror materials used in these devices.

DESCRIPTION OF THE RELATED ART

In recent years, much research has been performed in the development of bulk acoustic wave devices, primarily for use in cellular, wireless and fiber-optic communications, as well as in computer or computer-related information-exchange or information-sharing systems. There is a trend in such systems for operation at increasingly higher carrier frequencies, principally because the spectrum at lower frequencies has become relatively congested, and also because the permissible bandwidth is greater at higher frequencies. Piezoelectric crystals have provided the basis for bulk acoustic wave devices for filtering or frequency control such as oscillators, acoustic resonators and filters, operating at very high radio frequencies (on the order of several gigahertz).

In many high-frequency applications, filters such as band pass and/or band stop filters are based on dielectric-filled electromagnetic cavity resonators with physical dimensions that are large, since they are dictated by the wavelength of the resonating electromagnetic wave. Due to the interaction between electrical charge, stress, and strain in a piezoelectric material, such material acts as a transducer, which converts energy back and forth between electromagnetic and acoustic (i.e., mechanical) energy. Thus, a piezoelectric material incorporated in a structure designed to have a strong mechanical resonance provides an electrically resonant device.

The velocity of an acoustic wave, however, is approximately $\frac{1}{10000}$ that of the velocity of an electromagnetic wave. This relationship between the wave's velocity and device dimensions thus allows a reduction of roughly this factor in the size of certain devices, including acoustic resonators, employing this material. In other words, an electrical filter based on acoustic waves may be much smaller than one based on electromagnetic waves. To achieve this size reduction, one must use a mechanical material that transduces between electromagnetic and mechanical energies. For example, such may be a piezoelectric, magnetostrictive or electrostrictive material. Although the discussion below focuses on piezoelectric materials for transduction, the transduction is not limited to these materials, but may by attained using one of the other above-noted materials, and/or a combination thereof.

Acoustic resonator devices containing piezoelectric materials, such as thin film resonators (hereinafter "TFR") are typically used in high-frequency environments ranging from several hundred megahertz (MHz) to several gigahertz (GHz). FIG. 1 illustrates a side view of a conventional TFR component 100. In FIG. 1, TFR component 100 includes a piezoelectric material 110 interposed between two conductive electrode layers 105 and 115, with electrode layer 115 formed on a support structure 120.

The support structure 120 can be a plurality of alternating reflecting layers (acoustic mirrors) provided on a solid semiconductor substrate which may be made of silicon, sapphire, glass or quartz, for example. The support structure 120 can alternatively be removed after device fabrication leaving a free standing membrane type device. The piezoelectric material is commonly selected from the group comprising at least ZnO, CdS and AlN. Electrode layers 105 and 115 are generally formed from a conductive material, such of Al, but may be formed from other conductors as well.

These acoustic resonator devices are often used in filters, more particularly in TFR band pass and/or band stop filter circuits applicable to a myriad of communication technologies. For example, TFR filter circuits may be employed in cellular, wireless and fiber-optic communications, as well as in computer or computer-related information-exchange or information-sharing systems.

In these acoustic devices, any sympathetic vibration or mode has a response curve showing how at a certain frequency the amplitude of mechanical response goes through a peaked maximum for fixed excitation strength. Because of the coupling of mechanical and electrical energy in a piezoelectric film, there is also an electrical current response peak where the film produces a maximum current for a fixed voltage since the mechanical motion produces charge at the surface of the piezo. This peak defines the "zero" resonant frequency of a acoustic resonator (i.e., the term refers to the zero or low impedance to the flow of current.)

The piezoelectric film also produces a polarization current like a capacitor, since it is a dielectric. This current increases linearly with frequency for a fixed voltage, and since the mechanical resonance is narrow (about 1 part in 100 changes in frequency) the polarization current can be essentially thought of as constant while the piezoelectric current goes through its peak.

In view of the above, a second electrical feature, the "pole" frequency or frequency of highest impedance can now be understood. The pole frequency is the frequency at which the piezoelectric and polarization currents most nearly or substantially cancel each other out. Since the piezoelectric current has a peak and reverses its polarity through resonance, its value essentially cancels that of the nearly constant polarization current at one frequency—the pole frequency. Therefore, the separation between pole and zero resonant frequencies is dependent in one respect on the properties of the piezoelectric material, and the mechanical resonance that is explained in more detail below.

As discussed above, the separation in frequency between pole and zero resonant frequencies in an acoustic device such as a TFR is determined by properties of the piezoelectric film, and more particularly by the mechanical and electrical properties and/or characteristics of the piezoelectric. For a piezoelectric film comprised of AlN, the fractional separation is about 3% of the resonance frequency for a plate geometry suspended in air, such as in a membrane type TFR (e.g. the lateral dimension is large as compared to the film's thickness).

FIG. 2 illustrates a conventional Bragg reflector stack constituting acoustic mirror layers of an acoustic device such as a TFR. The reflecting stack 125 of FIG. 2 corresponds somewhat to substrate 120 of FIG. 1, and illustrates the make up of the acoustic mirrors in more detail. Referring to FIG. 2, the conventional acoustic mirror arrangement or Bragg reflecting stack 125 comprises a plurality of alternating mirror layers of a high acoustic impedance material, such as AlN layers 130a–d, and a low acoustic impedance material such as $SiO_2$ layers 135a–d, that are provided on a substrate 140 such as silicon, for example. Other conventional reflecting stacks used in acoustic devices such as TFRs typically include acoustic mirror layer combinations of $Si_3N_{4\pm x}/SiO_2$ as well.

Acoustic impedance is the product of a material's density and speed. This relation is important because, as a sound wave passes between two unlike materials, the portion of the wave reflected by the interface therebetween is larger for a greater difference in impedance between the differing materials. Accordingly, a common theme of the inventors is that, in order to fabricate a good acoustic mirror, and hence acoustic resonant device, it is desirable to place materials having as dissimilar impedance as possible against each other for maximal reflections.

However, there is at least one drawback in fabricating acoustic resonator devices such as TFRs with the reflecting stack 125 illustrated in FIG. 2. The mechanical resonance, and hence the piezoelectric current response peak of the resonator is altered when a device is fabricated on an acoustic mirror, as compared to the case where the device is fabricated as a membrane. Unfortunately, for a resonator solidly mounted on an acoustic mirror, the pole frequency is reduced to a value closer to the zero frequency of the resonator. Moreover, use of conventional acoustic mirrors comprised of the above-noted AlN/SiO₂ layers (as well as the $Si_3N_{4\pm x}/SiO_2$ layer combination) disadvantageously reduce this separation to around 2%, down from the 3% achievable when an AlN piezoelectric layer is in a membrane form.

This is an undesirable characteristic, because in filter design the maximum bandpass filter bandwidth achievable is proportional to the pole-zero separation. Additionally, important filter applications such as GSM (global system for mobile communications, a cell phone standard widely used in non-US based systems) require substantially all or as much of the bandwidth that an AlN membrane-based TFR filter can provide. Thus, using a non-optimal acoustic mirror may prohibit AlN from being used as the piezoelectric material in some of the larger market filter applications, such as GSM noted above.

Further, the current acoustic mirror arrangement requires a substantial number of alternating reflective layers, providing for a bulkier resonator device that requires longer manufacturing process time and cost. This is because the number of layers required depends on the degree of acoustic mismatch between them, and the AlN/SiO₂ and $Si_3N_{4\pm x}/SiO_2$ layer combinations currently used do not represent the highest possible impedance mismatch. To restate, at each interface there is a reflection of energy; and if each reflection is weak because of poor impedance mismatch, more layers are therefore required to achieve the total desired reflection.

Accordingly, the greater the acoustic impedance mismatch between the piezoelectric layer and the topmost or first acoustic mirror layer, the closer the acoustic device approaches its maximum achievable bandwidth, or limit achievable, as compared to the case where the layer was made of air, for example. Air presents an enormous impedance mismatch with any solid material, simply because its density is typically a factor of at least 1000 lower than the density of the adjacent solid material. Maximal impedance mismatch is also important, albeit to a lesser extent, for the interfaces between each pair of subsequent mirror layers, since it is always beneficial to have a large acoustic impedance mismatch, when maximum bandwidth and fewer required layers are desired. Therefore, what is needed is a reflecting stack for an acoustic device which can attain the highest possible impedance mismatch between the reflecting layers of the stack so as to maximize bandwidth, and which reduces manufacturing costs by requiring fewer layers for the device, as compared to conventional acoustic mirrors.

SUMMARY OF THE INVENTION

The present invention provides a reflector stack for an acoustic device which comprises alternating layers of materials having a substantial acoustic impedance mismatch therebetween. In one aspect, the reflecting stack incorporates higher impedance layers of material that are determined based on the elastic constants and density of the materials, with known low impedance material layers to achieve a desired large mismatch.

In another aspect, the reflecting stack is formed from a low density material that is deposited by chemical vapor deposition (CVD) and/or sputtering on a substrate. The aforementioned higher impedance materials calculated as a function of their elastic constants may be combined with the low density material formed by CVD and/or sputtering to further increase the acoustic impedance mismatch, as well as to reduce the number of mirror layers required in the reflecting stack of the acoustic device.

BRIEF DESCRIPTION OF THE DRAWINGS

The present invention will become fully understood from the detailed description given hereinbelow and the accompanying drawings, wherein like elements represent like reference numerals, which are given by way of illustration only and thus are not limitative of the invention and wherein:

FIG. 1 illustrates a cross-section of a typical thin film resonator (TFR) acoustic resonator device;

FIG. 2 illustrates a conventional Bragg reflector stack of a TFR;

DETAILED DESCRIPTION

Figure 3:
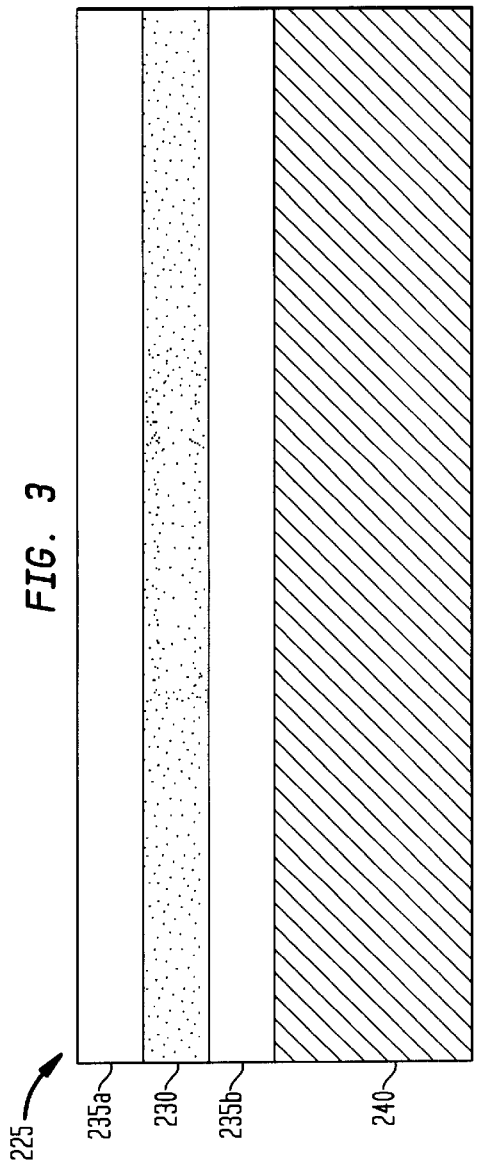
FIG. 3 illustrates an acoustic mirror arrangement where the reflector stack is configured as a conductor.

The present invention provides a reflecting stack or acoustic mirror arrangement for an acoustic device, which may attain the highest possible impedance mismatch between the reflecting layers of the stack so as to maximize bandwidth, and which may reduce manufacturing costs by requiring fewer layers for the device, as compared to conventional acoustic mirrors. The reflecting stack is fabricated in a reduced time to lower cost by incorporating materials providing a larger acoustic impedance mismatch than those currently attainable. In addition, the bandwidth of the resulting resonator device may be widened, particularly when the sputter-deposited and/or CVD low density material is the topmost layer as deposited in the acoustic mirror of the device.

The idea to use of a low density (at least about 1.0 g/cm³ or lower) material was determined from applications which utilize a low density dielectric constant material. However, the fact that these materials have low dielectric constants is superfluous, it is the low density characteristics of these materials that is desirable to applications in the aforementioned acoustic devices. Moreover, what is even more important is the fact that the same process used to lower the dielectric constant of the low density material may also be used to lower its density, and therefore its impedance. This in turn enables a higher impedance mismatch between layers of the stack to be achieved, of which is particularly crucial between the topmost, or first low density material layer in the mirror arrangement, and the piezoelectric material layer.

As discussed above, the separation in frequency between pole and zero resonant frequencies in an acoustic device such as a TFR is determined by the mechanical and electrical properties and/or characteristics of the piezoelectric. For a piezoelectric film comprised of AlN, the fractional separation is about 3% of the resonance frequency for a plate geometry suspended in air.

Alternating low and high acoustic impedance materials of quarter wave thickness transform the impedance of the substrate to a greatly reduced value due to the constructive interference of reflections from boundaries between the many layers. This keeps the acoustic energy favorably trapped and resonant near the piezoelectric layer. However, bigger mismatch between piezo and mirror and/or between mirror complimentary materials results in a widening of the range of frequencies of this effectively lowered acoustic impedance; i.e., it keeps the energy trapped even more favorably in the immediate topmost layers. The limit to this desired broad range of low impedance is when air, with its very low impedance, is used instead of a low impedance material as the first layer in the mirror.

The effect of this ideal air "mirror" is accordingly independent of frequency. The result of a broader range of reduced impedance is a lessening of the change in mechanical response of the resonator device, near its resonance, due to the mirror, and thus a closer to ideal (bulk or maximal value) separation between the zero and the pole of the impedance. As previously discussed, this separation is directly related to bandwidth—the greater the pole-zero separation, the wider the achievable bandwidth for an acoustic device (such as a bandpass filter) formed of resonator components having the reflecting stack of the present invention.

There are cases, however, where it is advantageous to manufacture a solidly mounted TFR device (for reliability, temperature effects, manufacturing simplicity etc . . . ). In this instance, the device loses the advantages of an acoustic device fabricated with an air interface. Since the most important acoustic impedance mismatch is of course the first one, that is, between the piezo film and the first or topmost mirror layer it is desirable to use a low density $SiO_2$ for the first mirror layer, mounted on a substrate of the acoustic device.

In one aspect of the invention, the reflecting stack incorporates higher impedance layers of piezoelectric material that are determined based on the elastic constants of the materials. To determine possible higher impedance materials that could be used in the reflecting stack, the inventors have utilized the following equations:

$$c\ (m/s) = \sqrt{\frac{C_{11}\ (N/m^2)}{\rho\ (kg/m^3)}} \quad \text{and} \quad (1)$$

$$Z\ (kg/m^2s) = \rho c; \quad (2)$$

where c is the speed of sound through the material and is calculated from the elastic constant ($C_{11}$) and density ($\rho$) of a selected material, and where Z is the acoustic impedance of the selected material, the acoustic impedance based on the speed calculated as a function of the elastic constant C.

Table 1 depicts the results of these calculations, listing the materials selected with their calculated Z.

TABLE 1

| Material | Density (g/cm$^3$) | $C_{11}$ (× 10$^{10}$N/m$^2$) | Speed (A/ps) | Z (10$^5$kg/m$^2$s) |
|---|---|---|---|---|
| WC | 15.7 | 115 | 66.3 | 1041 |
| TaC | 14.5 | 84 | 59.0 | 856 |
| ReO$_3$ | 11.4 | 112 | 70.8 | 808 |
| Cr$_3$Si | 6.52 | 85 | 88.4 | 577 |
| NbC | 7.80 | 69 | 72.8 | 568 |
| ZrC | 6.56 | 74 | 82.0 | 538 |
| TiC | 4.93 | 86 | 102.0 | 503 |
| LaB$_6$ | 4.68 | 76 | 98.4 | 460 |
| VC | 5.71 | 61 | 80.1 | 457 |
| AlN | 3.25 | 45 | 119.0 | 387 |
| SiC | 3.21 | 59 | 104.7 | 336 |
| Y$_2$O$_3$ | 4.84 | 38 | 68.5 | 331 |
| MgO | 3.58 | 49 | 90.6 | 324 |
| Si$_3$N$_{4\pm x}$ | 2.70 | 45 | 105.0 | 284 |
| B$_4$C | 2.51 | 48 | 107.5 | 270 |
| SrF$_2$ | 4.20 | 21 | 54.3 | 228 |
| BaF$_2$ | 4.90 | 15 | 43.0 | 211 |

In Table 1 are listed the specific material, density, elastic constant $C_{11}$, velocity of sound or speed and acoustic impedance Z. As seen from Table 1, currently used materials AlN and Si$_3$N$_{4\pm x}$ have acoustic impedance Z equal to 387 and 284×10$^5$ kg/m$^2$s respectively. These materials do not provide the kind of impedance mismatch desired in acoustic devices. Based on the calculations above, more desirable materials to use as the higher impedance material should have a Z at least as high as that of AlN, and more preferably above at least Z=400×10$^5$ kg/m$^2$s. Such materials include, but are not limited to: Al$_2$O$_3$, Cr$_3$Si, NbC, ReO$_3$, TaC, TaN, TiC, TiO$_2$, VC, WN, WO$_2$ and ZrC. Accordingly, these higher Z layers increase the impedance mismatch of the stack, thereby proving a wider attainable bandwidth for the acoustic device.

One of the reasons many of these materials have not previously been considered for use in reflecting stacks/mirror arrangements for acoustic devices include (1) design tradeoffs to account for, and/or (2) some materials are better for some kinds of applications (i.e., insulator versus conductor) than others. For example, some of the materials may have been more difficult to deposit (i.e., lower deposition rate) on a substrate than AlN or Si$_3$N$_{4\pm x}$; and therefore were not considered as viable for high-Z material layers in acoustic devices. Additionally, some of the materials may have contained parasitic capacitances of such a level that it would have been disadvantageous to use them in a particular application. As an example, WC (tungsten carbide) is desirable for conducting-type applications, but due to its high parasitic capacitance, would not be useful as an insulating layer for an acoustic device. Nevertheless, it is not known to utilize an elastic constants table in concert with investigating material density as a way of determining certain high-Z materials that can provide the kind of acoustic impedance mismatch desired in acoustic devices such as TFR band pass or band stop filters, and/or resonator-based frequency control circuits, for example.

In another aspect of the invention, in concert with or in lieu of using the higher impedance materials calculated above, a lower impedance $SiO_2$ material than that attained by convention physical vapor deposition (PVD) of $SiO_2$ in the acoustic mirror is provided by depositing the $SiO_2$ via chemical vapor deposition (CVD) or sputter deposition. Use of CVD and/or sputtering provides a $SiO_2$ layer having a lower density (about 1.0 g/cm$^3$ as compared to about 2.3 g/cm$^3$ for PVD $SiO_2$). Therefore, the lower density of the CVD/sputtered $SiO_2$ layer means a lower Z (low impedance)

material, which in turn provides a higher acoustic impedance mismatch between the piezo film and bottom layer, as well as between each pair: of low impedance $SiO_2$ layer and adjacent mirror layer of conventional high impedance material. The result is a thinner acoustic device requiring fewer mirror layers, which may reduce manufacturing time and production costs.

Figure 4:
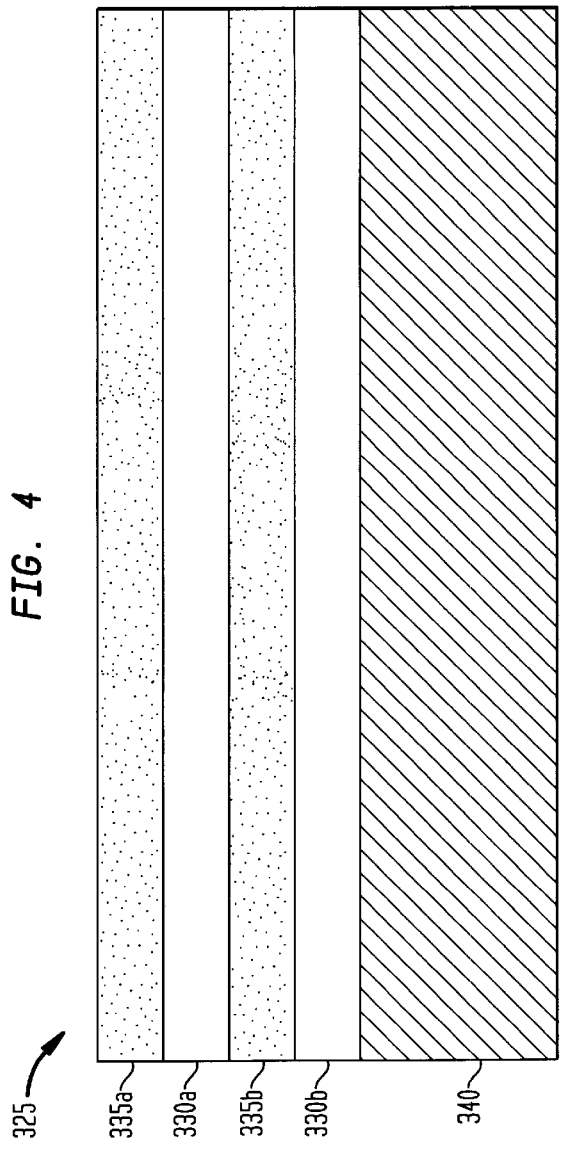
FIG. 4 illustrates an acoustic mirror arrangement where the reflector stack is configured as an insulator.

FIGS. 3 and 4 illustrates an acoustic mirror arrangement where the reflector stack is configured as a conductor and insulator respectively, and combine the advantages obtained by the higher impedance layers and low density material layers in accordance with the present invention. As seen in FIG. 3, the acoustic mirror arrangement 225 includes a high Z WC layer 230 (WC is known as a poor electrical insulator) sandwiched between two low density/low Z $SiO_2$ layers 235a and 235b formed by CVD/Sputtering on a Si substrate 240. In complicated filter designs, unwanted electrical coupling may result from using a conducting stack, but in simpler structures a conducting stack may be acceptable. If such electrical coupling is to be prevented, however, electrically conducting acoustic mirror layers such as the above-noted WC layer 135 should not be used.

As seen in FIG. 4, to configure the acoustic mirror arrangement 325 as an insulator, alternating layers of high Z $Al_2O_3$ layers 330a and 330b and low density/low Z $SiO_2$ layers 335a and 335b are formed on Si substrate 340. Both of these materials are known as good electrical insulators. Further, the desirable or exemplary non-insulating stack (WC and low density $SiO_2$) of FIG. 3 requires only 1½ pairs of mirror layers, and the desirable or exemplary insulating stack of FIG. 4 ($Al_2O_3$/poly-crystalline sapphire and low density $SiO_2$) requires only 2 pair of mirror layers.

To further illustrate the improved acoustic impedance mismatch and reduced layering attained by the invention, the inventors have determined impedance ratios and the required layer pairs needed to satisfy the ratio for several reflector stacks. Evaluated and compared were one stack comprising the conventional AlN/PVD $SiO_2$ layer configuration (typically used since the ability exists to deposit AlN as the piezo layer and standard $SiO_2$ is ubiquitous); a second manufactured of a $Si_3N_{4\pm x}$/PVD $SiO_2$ layer configuration (a poor combination but fabricated from readily available materials); and an AlN/CVD $SiO_2$ (low density $SiO_2$) layer configuration (conventionally used materials but employing the low density $SiO_2$ of the present invention, which is not currently used for making TFR devices).

For AlN/PVD $SiO_2$, the mirror arrangement has an impedance ratio of about 3:1, which requires 3–4 layer pairs. The $Si_3N_{4\pm x}$/PVD $SiO_2$ layer configuration requires 4–5 layer pairs, since it has only about a 1.5:1 impedance ratio. Conversely, the AlN/CVD $SiO_2$ (low density $SiO_2$) layer configuration needs only 2–3 layer pairs, due to its advantageous 6:1 impedance ratio. It can be concluded that the inclusion of the CVD/sputter deposited low density $SiO_2$ in the reflector stack/mirror arrangement provides for a higher impedance mismatch ratio, while requiring fewer layers than a reflector stack containing PVD $SiO_2$.

While the low density $SiO_2$ layer featured above in the embodiment provides obvious advantages over that of the conventional PVD $SiO_2$ layer in a reflector stack of an acoustic device, the inventors have found that aerogel or xerogels of $SiO_2$ for example, provide an even lower impedance material to use in the reflector stack. These materials are essentially foams created by the drying of gels in air (xero) or by supercritical solvent removal (aero). Aerogel is a light, fog-like substance which generally has the consistency of dried shaving cream, for example. The densities of xerogels are typically half those of the corresponding bulk material and those of aerogels can approach that of air itself. The terms are often used loosely, with aerogel meaning any very lower density dried gel. Although this discussion addresses silica aerogels, the material may be modified for lower density when air dried, may be based on $Al_2O_3$ or other inorganic oxides, or even may be based on organic materials.

To form an $SiO_2$ aerogel layer, a pre-cursor such as TEOS (tetraethylorthosilicate) is mixed with an acid catalyst such as alcohol and water to form a slurry film. The slurry film is then "spun" on the substrate by a well-known lithographic technique similar to that used for applying photo-resist. Once the slurry film has been applied, it is heated to preliminarily congeal it into a jello-like consistency. Thereafter, the gel may be dried in air or by a supercritical $CO_2$ treatment, depending on the desired density (i.e., there is a range of available densities depending on the desired application; thus the aerogel/xerogel layer could have a density of at least 0.3 $g/cm^3$, at least 0.5 $g/cm^3$, etc.).

The resultant aerogel film has an extremely low density (as low as 0.1 $g/cm^3$), and is an excellent attenuator of acoustic sound waves. The sound velocity is directly proportional to the density. For example, sound travels through an aerogel layer of density 0.1 $g/cm^3$ at a rate of about 170 A/ps, or about 6,000 times slower than sound velocity through a conventional PVD $SiO_2$ layer. Additionally, the elastic constant $C_{11}$ for the aerogel is about $2.7 \times 10^6$ $N/m^2$, whereas for conventional PVD $SiO_2$, $C_{11}$ is much larger—approximately $10.5 \times 10^{10}$ $N/m^2$. Further, if one uses higher materials such as those described in Table 1, together with a low impedance aerogel or xerogel layer, acoustic impedance mismatch ratios of at least 6:1 up to almost 6000:1 can be achieved (approximately a 6000:1 ratio for a reflecting stack made of alternating layers of WC and aerogel/xerogel).

Therefore, the reflecting stack of the present invention can combine higher impedance material layers which are determined based on the elastic constants of the materials, with known low impedance material layers to achieve a desired mismatch. Additionally, the reflecting stack can be formed from a low density material such as CVD $SiO_2$ or aerogel, so as to lower its density and therefore impedance, to achieve a higher impedance mismatch between layers of the stack, particularly between the topmost low density material layer of the acoustic mirror and the active piezoelectric layer. Further, the higher impedance mirror materials calculated as a function of their elastic constants may be combined with the low density material formed by CVD and/or sputtering to further increase the acoustic impedance mismatch so as to widen bandwidth of a resonator device containing the stack, as well as to reduce the number of mirror layers required (and hence cost) in manufacturing the reflecting stack of the acoustic device.

The invention being thus described, it will be obvious that the same may be varied in many ways. Such variations are not to be regarded as a departure from the spirit and scope of the invention, and also to modifications as would be obvious to one skilled in the art or intended to be included within the scope of the following claims.

What is claimed is:

1. A reflector stack for an acoustic device, comprising:
   a substrate; and
   alternating layers of high impedance and low impedance materials provided on said substrate,
   each layer having an acoustic impedance such that an acoustic impedance mismatch ratio between adjacent high and low impedance layers is in the range of about 10:1 to about 6000:1.

2. The reflector stack of claim 1, wherein the acoustic device is a thin film resonator (TFR).

3. The reflector stack of claim 1, wherein the acoustic device is a thin film resonator (TFR) in which energy is transduced between electrical and mechanical energy by piezoelectric, magnetostrictive, or electrostrictive means.

4. The reflector stack of claim 1, wherein the acoustic device is a TFR band pass filter, TFR band stop filter or resonator-based frequency control circuit.

5. The reflector stack of claim 1, wherein the high impedance layer is selected from the group comprising at least $Al_2O_3$, $Cr_3Si$, NbC, $ReO_3$, TaC, TaN, TiC, $TiO_2$, VC, WN, $WO_2$ and ZrC.

6. The reflector stack of claim 1, wherein the low impedance layer is $SiO_2$ having a density of about 1.0 g/cm$^3$.

7. The reflector stack of claim 1, wherein the low impedance layer is chemical vapor deposited (CVD) or sputter deposited $SiO_2$.

8. The reflector stack of claim 1, wherein the low impedance layer is an aerogel or xerogel layer having a density of about at least 0.5 g/cm$^3$.

9. The reflector stack of claim 1, wherein the high impedance materials are determined based on the equations:

$$c \, (m/s) = \sqrt{\frac{C_{11} \, (N/m^2)}{\rho \, (kg/m^3)}} \text{ and} \quad (1)$$

$$Z \, (kg/m^2 s) = \rho c; \quad (2)$$

where c is the speed of sound traveling through the selected high impedance material and is calculated from the elastic constant ($C_{11}$) and the density ($\rho$) of the selected material, and Z is the acoustic impedance of the selected material, which is based on the speed calculated as a function of the elastic constant $C_{11}$.

10. The reflector stack of claim 1, wherein the substrate is selected from the group comprising at least silicon, sapphire, glass and quartz.

11. The reflector stack of claim 1, wherein the high impedance materials have an acoustic impedance Z (kg/m$^2$s) of at least Z=400×10$^5$ kg/m$^2$s.

12. A reflector stack for an acoustic device, comprising:
a substrate; and
alternating high impedance layers and low impedance layers provided on said substrate,
the low impedance material layers being aerogel or CVD/sputter deposited $SiO_2$ layers, each layer having an acoustic impedance such that an acoustic impedance mismatch ratio between adjacent high impedance and low impedance layers is in the range of about 10:1 to about 6000:1.

13. The reflector stack of claim 12, wherein the CVD/sputter deposited $SiO_2$ material layer has a density of about 1.0 g/cm$^3$.

14. The reflector stack of claim 12, wherein the aerogel material layer has a density of about at least 0.3 g/cm$^3$.

15. The reflector stack of claim 12, wherein the high impedance materials have an acoustic impedance Z (kg/m$^2$s) of at least Z=400×10$^5$ kg/m$^2$s.

16. A reflector stack for an acoustic device, comprising:
a substrate; and
alternating layers of high impedance and low impedance materials provided on said substrate, each layer having an acoustic impedance,
the high impedance materials having an acoustic impedance Z (kg/m$^2$s) of at least Z=400×10$^5$ kg/m$^2$s,
the low impedance materials having a density of about 1.0 g/cm$^3$ or less, and
an acoustic impedance mismatch ratio between adjacent high impedance and low impedance layers being in the range of about 10:1 to about 6000:1.

17. The reflector stack of claim 16, wherein the acoustic device is a thin film resonator (TFR) in which energy is transduced between electrical and mechanical energy by piezoelectric, magnetostrictive, or electrostrictive means.

18. The reflector stack of claim 16, wherein the acoustic device is a TFR band pass filter, TFR band stop filter or resonator-based frequency control circuit.

19. The reflector stack of claim 16, wherein the high impedance layer is selected from the group comprising at least $Al_2O_3$, $Cr_3Si$, NbC, $ReO_3$, TaC, TaN, TiC, $TiO_2$, VC, WN, $WO_2$ and ZrC.

20. The reflector stack of claim 16, wherein the low impedance layer is an aerogel layer having a density of about at least 0.3 g/cm$^3$.

21. The reflector stack of claim 16, wherein the low impedance layer is CVD or sputter deposited $SiO_2$ having a density of about 1.0 g/cm$^3$.

22. The reflector stack of claim 1, wherein the high impedance layers are composed of materials having a an acoustic impedance Z (kg/m$^2$s) at least Z=400×10$^5$ kg/m$^2$s, and the low impedance layers are composed of aerogel.

23. The reflector stack of claim 1, wherein the high impedance layers are composed of materials having a an acoustic impedance Z (kg/m$^2$s) of at least Z=400×10$^5$ kg/m$^2$s, and the low impedance layers are composed of CVD $SiO_2$ having a density of about 1.0 g/cm$^3$.

24. A reflector stack for an acoustic device, comprising:
a substrate; and
alternating layers of high impedance and low impedance materials provided on said substrate, the high impedance layers being composed of materials having a an acoustic impedance Z (kg/m$^2$s) of at least Z=400×10$^5$ kg/m$^2$s, the low impedance layers being composed of aerogel, so that an acoustic impedance mismatch ratio between adjacent high impedance and low impedance layers is in the range of about 10:1 to about 6000:1.

25. A reflector stack for an acoustic device, comprising:
a substrate; and
alternating layers of high impedance and low impedance materials provided on said substrate, wherein said high impedance layers being composed of materials having a an acoustic impedance Z (kg/m$^2$s) of at least Z=400×10$^5$ kg/m$^2$s, and the low impedance layers being composed of CVD $SiO_2$ having a density of about 1.0 g/cm$^3$, so that an acoustic impedance mismatch ratio between adjacent high impedance and low impedance layers is in the range of about 10:1 to about 6000:1.

26. The reflector stack of claim 1, wherein the low impedance layer is an aerogel layer having a density as low as 0.1 g/cm$^3$.

27. The reflector stack of claim 1, wherein the low impedance layer has a density as low as 0.1 g/cm$^3$, when the low impedance layer is an aerogel layer.

28. The reflector stack of claim 16, wherein the low impedance layer is an aerogel layer having a density as low as 0.1 g/cm$^3$.

29. The reflector stack of claim 24, wherein the aerogel layer has a density as low as 0.1 g/cm$^3$.

* * * * *